(12) United States Patent
Kang et al.

(10) Patent No.: US 8,110,508 B2
(45) Date of Patent: Feb. 7, 2012

(54) METHOD OF FORMING A BUMP STRUCTURE USING AN ETCHING COMPOSITION FOR AN UNDER BUMP METALLURGY LAYER

(75) Inventors: Dong-Min Kang, Anyang-si (KR); Bo-Ram Kang, Suwon-si (KR); Young-Nam Kim, Suwon-si (KR); Young-Sam Lim, Bucheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 489 days.

(21) Appl. No.: 12/292,643

(22) Filed: Nov. 21, 2008

(65) Prior Publication Data
US 2009/0176363 A1 Jul. 9, 2009

(30) Foreign Application Priority Data

Nov. 22, 2007 (KR) .................. 10-2007-0119639
Sep. 22, 2008 (KR) .................. 10-2008-0092821

(51) Int. Cl.
*H01L 21/28* (2006.01)
*H01L 21/306* (2006.01)

(52) U.S. Cl. ............... 438/745; 438/613; 257/E21.575

(58) Field of Classification Search ............. 438/613, 438/597, 689, 745; 257/E21.477, E21.575, 257/E21.214, E21.215
See application file for complete search history.

(56) References Cited

U.S. PATENT DOCUMENTS

| 5,656,858 | A  | * | 8/1997  | Kondo et al. | ........... 257/737 |
| 6,559,070 | B1 | * | 5/2003  | Mandal | ............... 438/781 |
| 7,419,945 | B2 |   | 9/2008  | Hsu | |
| 2001/0039251 | A1 | * | 11/2001 | Sachdev et al. | ....... 510/177 |
| 2002/0098779 | A1 |   | 7/2002  | Tsai et al. | |
| 2003/0234184 | A1 | * | 12/2003 | Liu et al. | ............. 205/680 |
| 2004/0014319 | A1 | * | 1/2004  | Sahota et al. | ......... 438/692 |
| 2004/0087184 | A1 | * | 5/2004  | Mandal et al. | ........ 438/781 |
| 2004/0096672 | A1 | * | 5/2004  | Lukas et al. | .......... 428/446 |
| 2005/0176602 | A1 |   | 8/2005  | Hsu | |
| 2010/0043823 | A1 | * | 2/2010  | Lee | ..................... 134/1.3 |

FOREIGN PATENT DOCUMENTS

| CN | 1646649 A | | 7/2005 |
| JP | 08-013166 A | | 1/1996 |
| KR | 10-2002-0019422 A | | 3/2002 |
| KR | 10-2005-0019103 A | | 2/2005 |
| KR | 2008104798 A | * | 12/2008 |
| WO | WO 03/072672 A1 | | 9/2003 |

* cited by examiner

*Primary Examiner* — Jarrett Stark
*Assistant Examiner* — Michele Fan
(74) *Attorney, Agent, or Firm* — Lee & Morse, P.C.

(57) ABSTRACT

In an etching composition for an under-bump metallurgy (UBM) layer and a method of forming a bump structure, the etching composition includes about 40% by weight to about 90% by weight of hydrogen peroxide ($H_2O_2$), about 1% by weight to about 20% by weight of an aqueous basic solution including ammonium hydroxide ($NH_4OH$) or tetraalkylammonium hydroxide, about 0.01% by weight to about 10% by weight of an alcohol compound, and about 2% by weight to 30% by weight of an ethylenediamine-based chelating agent. The etching composition may effectively etch the UBM layer including titanium or titanium tungsten and remove impurities. A method of forming a bump structure may employ such an etching composition.

11 Claims, 5 Drawing Sheets

METHOD OF FORMING A BUMP STRUCTURE USING AN ETCHING COMPOSITION FOR AN UNDER BUMP METALLURGY LAYER

BACKGROUND

1. Technical Field

Exemplary embodiments relate to an etching composition for an under-bump metallurgy (UBM) layer, and a method of forming a bump structure. More particularly, exemplary embodiments relate to an etching composition for preventing and/or reducing impurities from being generated on a conductive bump, and a method of forming a bump structure using the same.

2. Description of the Related Art

Generally, a conductive bump is employed for electrically connecting a semiconductor chip with electronic equipment. An electrical die sorting (EDS) process may be performed to examine the performance of the semiconductor chip on which the conductive bump is formed. EDS processes measure electrical characteristics of the semiconductor chip on which the conductive bump is formed using a probe station to confirm whether the semiconductor chip has defects. The probe station includes a probe card for inputting/outputting an electrical signal through a probe tip, which directly makes contact with the conductive bump. The probe card analyzes the electrical signal to detect the defects of the semiconductor chip on which the conductive bump is formed.

A conductive bump may be formed using an electroplating solution and an electroplating process. The electroplating solution may include a compound having a cyano group or a compound without a cyano group. Lately, an electroplating solution including a compound without a cyano group, such as sodium gold sulfite ($Na_3Au(SO_3)_2$), has been more widely used than an electroplating solution including a compound having a cyano group, such as potassium gold cyanide ($KAu(CN)_2$). As a result, a toxic gas such as hydrogen cyanide (HCN) is not generated during a subsequent process. Further, the conductive bump has a denser structure.

However, when the conductive bump is formed using a compound without the cyano group, impurities may remain on the conductive bump. Such impurities may cause a process error during an EDS process. More particularly, when an under-bump metallurgy (UBM) layer exposed by the conductive bump is etched, impurities may be generated and the generated impurities may attach to a probe tip and cause an error in the analysis of an electrical signal. The impurities may include metal impurities such as aluminum (Al) from a pad or titanium (Ti) from the UBM layer, polyimide or silicon oxynitride (SiON) from a passivation layer, or oxide impurities such as aluminum oxide or titanium oxide. As a result of such impurities, although a semiconductor chip may be appropriately performed, the probe station may output inappropriate results indicating an electrical short or an electrical open circuit in the semiconductor chip.

In view of the foregoing, a cleaning process may be performed to remove the impurities from tip(s) of a probe card before and/or after an EDS process. However, cleaning processes may be abrasive and may damage the probe tip. Thus, productivity may be reduced. Further, such cleaning processes may not sufficiently remove the impurities from a probe tip. Thus, a method(s) capable of preventing generation of the impurities is desired.

SUMMARY

Embodiments are therefore directed to an etching composition for an UBM layer that may substantially and/or completely overcome one or more problems due to limitations and disadvantages of the related art.

Exemplary embodiments provide an etching composition for an UBM layer that may reduce and/or prevent impurities that may result during formation of a bump structure from a conductive bump.

Exemplary embodiments provide an etching composition for an UBM layer that may improve reliability of EDS processes by reducing and/or preventing impurities that may attach to a probe tip of a probe card.

Exemplary embodiments provide a method of forming a bump structure using an etching composition that results in relatively fewer impurities on a conductive bump that may attach to a probe card and cause errors in the analysis of an electrical signal being analyzed therewith.

Exemplary embodiments to provide an etching composition for etching an UBM layer that may form a protective layer on a conductive bump to prevent and/or reduce etching residue or impurities that may be generated during formation of the conductive bump from attaching to the conductive bump.

Exemplary embodiments provide an etching composition for etching an UBM layer that may efficiently remove etching residue or impurities, which may be generated during formation of a conductive bump, from the conductive bump without damaging a polyimide layer, and aluminum layer and/or a silicon oxynitride layer.

Exemplary embodiments provide an etching composition for etching an UBM layer that may result in relatively fewer and/or no impurities, which may result during formation of a conductive bump, and may prevent impurities from attaching to a probe card during an EDS process and increasing a contact resistance.

Exemplary embodiments provide an etching composition that may reduce a frequency of a cleaning process for cleaning a probe tip due to impurities, which may be generated during formation of a conductive bump, and may improve productivity.

At least one of exemplary embodiments may be realized by providing an etching composition for an under-bump metallurgy (UBM) layer including about 40% by weight to about 90% by weight of hydrogen peroxide ($H_2O_2$), about 1% by weight to about 20% by weight of an aqueous basic solution including ammonium hydroxide ($NH_4OH$) or tetraalkylammonium hydroxide, about 0.01% by weight to about 10% by weight of an alcohol compound, and about 2% by weight to about 30% by weight of an ethylenediamine-based chelating agent.

The etching composition may include about 68% by weight to about 77% by weight of hydrogen peroxide, about 7% by weight to about 14% by weight of the aqueous basic solution including ammonium hydroxide, about 0.1% by weight to about 3% by weight of the alcohol compound, and about 15% by weight to about 20% by weight of the ethylenediamine-based chelating agent, and the UBM layer includes titanium (Ti).

A weight ratio of the aqueous basic solution including ammonium hydroxide to hydrogen peroxide may be in a range of about 1:6 to about 1:9.

The etching composition may include about 75% by weight to about 83% by weight of hydrogen peroxide, about 1% by weight to about 7% by weight of the aqueous basic solution including tetraalkylammonium hydroxide, about 0.01% by weight to about 3% by weight of the alcohol compound, and about 15% by weight to about 20% by weight of the ethylenediamine-based chelating agent, and the UBM layer includes titanium tungsten (TiW).

The etching composition may include about 1 ppm to about 1,000 ppm of a nonionic surfactant. The nonionic surfactant may include a copolymer of polyethylene oxide and polypropylene oxide, or a block copolymer of polyethylene glycol and polypropylene glycol.

The aqueous basic solution may include about 25% by weight to about 50% by weight of ammonium hydroxide. The aqueous basic solution may include about 15% by weight to about 35% by weight of tetraalkylammonium hydroxide. The ethylenediamine-based chelating agent may include ethylenediaminetetraacetic acid (EDTA), ethylenediaminetetraacetic acid dipotassium salt (EDTA-2K), ethylenediaminetetraacetic acid disodium salt (EDTA-2Na), or ethylenediaminetetraacetic acid tetrasodium salt (EDTA-4Na).

At least one of exemplary embodiments may be realized by providing a method of forming a bump structure, including forming a pad electrically connected to a semiconductor chip on a substrate, forming a passivation layer pattern on the substrate that exposes the pad, forming an under-bump metallurgy (UBM) layer on the passivation layer pattern and on the pad exposed by the passivation layer pattern, forming a conductive bump on the UBM layer, and removing a portion of the UBM layer using the conductive bump as a mask with an etching composition including about 40% by weight to about 90% by weight of hydrogen peroxide ($H_2O_2$), about 1% by weight to about 20% by weight of an aqueous basic solution including ammonium hydroxide ($NH_4OH$) or tetraalkylammonium hydroxide, about 0.01% by weight to about 10% by weight of an alcohol compound, and about 2% by weight to about 30% by weight of an ethylenediamine-based chelating agent.

Removing the portion of the UBM layer may include etching the UBM layer using the etching composition at a temperature of about 40° C. to about 70° C. for about 1 minute to about 5 minutes.

After removing the UBM layer, the method may include performing a heat treatment on the substrate on which the conductive bump is formed.

After performing the heat treatment, the method may include cleaning the bump structure using the etching composition at a temperature of about 20° C. to about 40° C. for about 30 seconds to about 1 minute.

The UBM layer may include at least one of titanium tungsten (TiW), chromium (Cr), copper (Cu), titanium (Ti), nickel (Ni), nickel vanadium (NiV), palladium (Pd), chromium/copper (Cr/Cu), titanium tungsten/copper (TiW/Cu), titanium tungsten/gold (TiW/Ag) and nickel vanadium/copper (NiV/Cu) and mixtures thereof.

The pad may include aluminum and the passivation layer may include at least one of polyimide or silicon oxynitride.

BRIEF DESCRIPTION OF THE DRAWINGS

Exemplary embodiments will become more apparent to those of ordinary skill in the art by describing in detail exemplary embodiments with reference to the attached drawings, in which.

DETAILED DESCRIPTION

Figure 1:
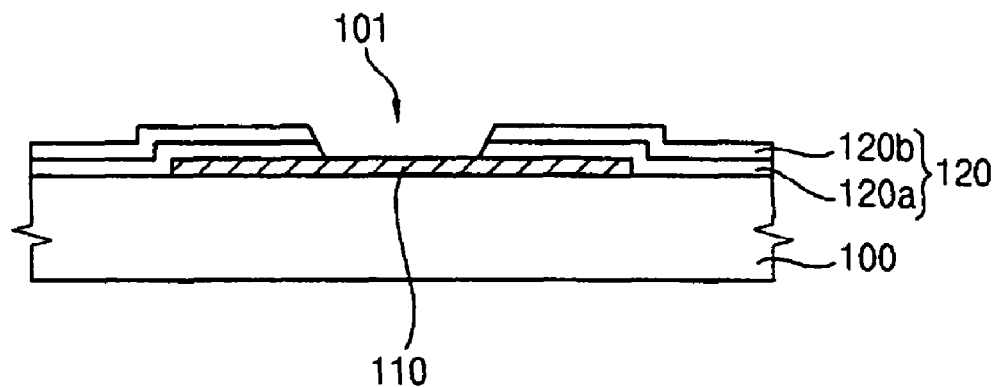
FIGS. 1, 2, 3, 4, 5, 6 and 7 illustrate cross-sectional views of stages in an exemplary method of forming a bump structure according to an exemplary embodiment.

Korean Patent Application Nos. 2007-119639, filed on Nov. 22, 2007, and 2008-92821, filed on Sep. 22, 2008, in the Korean Intellectual Property Office, are incorporated by reference herein in their entirety.

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that when an element or layer is referred to as being "on," "connected to" another element or layer, it can be directly on or connected to the other element or layer or intervening elements or layers may be present. In contrast, when an element is referred to as being "directly on," "directly connected to" another element or layer, there are no intervening elements or layers present. Like numerals refer to like elements throughout the specification. As used herein, the term "and/or" includes any and all combinations of one or more of the associated listed items.

The terminology used herein is for the purpose of describing particular exemplary embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the expressions "at least one" and "and/or" are open-ended expressions that are both conjunctive and disjunctive in operation. For example, each of the expressions "at least one of A, B, and C," "at least one of A, B, or C," "one or more of A, B, and C," and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An exemplary etching composition for an under-bump metallurgy (UBM) layer will be described below.

An etching composition for a UBM layer may include about 40% by weight to about 90% by weight of hydrogen peroxide ($H_2O_2$), about 1% by weight to about 20% by weight of an aqueous basic solution including ammonium hydroxide ($NH_4OH$) or tetraalkylammonium hydroxide, about 0.01% by weight to about 10% by weight of an alcohol compound and about 2% by weight to about 30% by weight of an ethylenediamine-based chelating agent. The etching composition may further include a nonionic surfactant as an additive. The UBM layer may be formed using, e.g., titanium (Ti) or titanium tungsten (TiW).

Hydrogen peroxide included in the etching composition may effectively dissolve impurities. In exemplary embodiments, hydrogen peroxide may oxidize impurities including titanium (Ti), titanium oxide ($TiO_x$), tungsten (W), tungsten oxide ($WO_y$) and/or organic impurities, which may remain on a conductive bump and a UBM layer pattern under the conductive bump. Hydrogen peroxide may form a thin oxide layer on the conductive bump. The thin oxide layer may prevent and/or reduce adhesion of impurities generated by an etching process on the conductive bump.

When the etching composition includes less than about 40% by weight of hydrogen peroxide based on a total weight of the etching composition, impurities may not be effectively removed from the conductive bump and the UBM layer pattern. When the etching composition includes more than about 90% by weight of hydrogen peroxide, the UBM layer pattern resulting from etching of the UBM layer, may be excessively oxidized by hydrogen peroxide and may be damaged. Therefore, in embodiments, the etching composition may include about 40% by weight to about 90% by weight of hydrogen peroxide.

The aqueous basic solution including ammonium hydroxide may remove titanium included in the UBM layer and may dissolve impurities, e.g., titanium, titanium oxide and/or the organic impurities, which may remain on the conductive bump. In exemplary embodiments, the aqueous basic solution including ammonium hydroxide may include about 25% by weight to about 50% by weight of ammonium hydroxide.

The aqueous basic solution including tetraalkylammonium hydroxide may remove titanium tungsten included in the UBM layer and may dissolve impurities, e.g., titanium, tungsten, titanium oxide, tungsten oxide and/or the organic impurities that may remain on the conductive bump. In exemplary embodiments, the aqueous basic solution including tetraalkylammonium hydroxide may include about 15% by weight to about 35% by weight of tetraalkylammonium hydroxide.

When the etching composition includes less than about 1% by weight of the aqueous basic solution including ammonium hydroxide or tetraalkylammonium hydroxide based on the total weight of the etching composition, impurities may not be effectively removed from the conductive bump. When the etching composition includes more than about 20% by weight of the aqueous basic solution including ammonium hydroxide or tetraalkylammonium hydroxide, the UBM layer pattern including titanium or titanium tungsten may be eroded by the etching composition and may damage the conductive bump. Thus, in embodiments, the etching composition may include about 1% by weight to about 20% by weight of the aqueous basic solution including ammonium hydroxide or tetraalkylammonium hydroxide.

In exemplary embodiments, a weight ratio of the aqueous basic solution including ammonium hydroxide to the hydrogen peroxide may affect an etching rate of titanium included in the UBM layer and may cause damage to a pad including aluminum. When the weight ratio of hydrogen peroxide with respect to the aqueous basic solution including ammonium hydroxide is less than about 6, the pad including aluminum may be damaged and the etching rate of titanium may be reduced. When the weight ratio of hydrogen peroxide with respect to the aqueous basic solution including ammonium hydroxide is more than about 9, the etching rate of the UBM layer may be increased. However, aluminum included in the pad may be etched with titanium included in the UBM layer. Thus, the weight ratio of the aqueous basic solution including ammonium hydroxide to hydrogen peroxide may be about 1:6 to about 1:9.

The alcohol compound included in the etching composition may remove organic impurities generated while the conductive bump is formed by an electroplating process.

In exemplary embodiments, the alcohol compound included in the etching composition may include a $C_1$-$C_4$ monoalcohol, a $C_1$-$C_4$ diol, a $C_1$-$C_6$ aminoalcohol, etc. These may be used alone or in a mixture thereof. For example, the alcohol compound may include methanol, ethanol, propanol, butanol, ethyleneglycol, propanediol, butanediol, monoethanolamine, diethanolamine, triethanolamine, propanolamine, etc.

When the etching composition includes less than about 0.01% by weight of the alcohol compound, the organic impurities may remain on the conductive bump after etching the UBM layer. Further, the metal, e.g., titanium or titanium tungsten, in the UBM layer pattern under the conductive bump may be etched. When the etching composition includes more than about 10% by weight of the alcohol compound, removal efficiency of the organic impurities may not improve compared to that of the etching composition including about 10% by weight of the alcohol compound, and the amount of the metal, e.g., titanium, remaining on the conductive bump may be higher. Thus, in embodiments, the etching composition may include about 0.01% by weight to about 10% by weight of the alcohol compound.

The ethylenediamine-based chelating agent included in the etching composition may prevent a metal ion, e.g., a titanium ion, which may be generated during the etching process from reacting with an oxidant, e.g., hydrogen peroxide, and forming a metal oxide, e.g., titanium oxide. The ethylenediamine-based chelating agent may react with a metal ion, e.g., titanium ion, to form a stable chelate compound.

In exemplary embodiments, the ethylenediamine-based chelating agent may include ethylenediaminetetraacetic acid (EDTA), ethylenediaminetetraacetic acid dipotassium salt (EDTA-2K), ethylenediaminetetraacetic acid disodium salt (EDTA-2Na), ethylenediaminetetraacetic acid tetrasodium salt (EDTA-4Na), etc. For example, the ethylenediamine-based chelating agent may be ethylenediaminetetraacetic acid dipotassium salt (EDTA-2K).

When the etching composition includes less than about 2% by weight of the ethylenediamine-based chelating agent, the metal ion, e.g., the titanium ion, which may be generated during the etching process, may not react with the ethylenediamine-based chelating agent and may not form a stable chelate compound. When the etching composition includes more than about 30% by weight of the ethylenediamine-based chelating agent, an amount of the ethylenediamine-based chelating agent may be more than that of the metal ion that may be generated during the etching process of the UBM layer. Thus, an excess of the ethylenediamine-based chelating agent may not react with the metal ion. As a result, the ethylenediamine-based chelating agent may remain on the conductive bump. Thus, in embodiments, the etching composition may include about 2% by weight to about 30% by weight of the ethylenediamine-based chelating agent.

The etching composition may further include an additive. The additive may include about 1 ppm to about 1,000 ppm of a nonionic surfactant. The nonionic surfactant may dissolve impurities, e.g., the metal such as titanium, the metal oxide such as the titanium oxide or tungsten oxide, the organic impurities, so that the etching composition may permeate into the impurities attached to the conductive bump. Thus, removal efficiency of the impurities may be enhanced.

In exemplary embodiments, the nonionic surfactant may include a copolymer of polyethylene oxide and polypropylene oxide or a block copolymer of polyethylene glycol and polypropylene glycol. For example, the nonionic surfactant may include NCW (trade name; manufactured by Wako Pure Chemical Industries, Ltd. in Japan) or Synperonic PE/F68, Synperonic PE/L61 or Synperonic PE/L64 (trade names; manufactured by Fluka Chemie GmBH in Germany).

When the etching composition includes less than about 1 ppm of the nonionic surfactant, the etching composition may not easily permeate into the impurities attached to the conductive bump, so that the removal efficiency of the impurities may be reduced. When the etching composition includes more than about 1,000 ppm of the nonionic surfactant, the removal efficiency of the impurities may not be substantially improved and the nonionic surfactant may remain on the conductive bump after the etching process of the UBM layer. Thus, the etching composition may further include about 1 ppm to about 1,000 ppm of the nonionic surfactant.

In exemplary embodiments, when the UBM layer includes titanium, the etching composition may include about 68% by weight to about 77% by weight of hydrogen peroxide, about 7% by weight to about 14% by weight of the aqueous basic solution including ammonium hydroxide, about 0.1% by weight to about 3% by weight of the alcohol compound, and about 15% by weight to about 20% by weight of the ethylenediamine-based chelating agent. The etching composition may further include about 1 ppm to about 1,000 ppm of the nonionic surfactant as the additive.

In exemplary embodiments, when the UBM layer includes titanium tungsten, the etching composition may include about 75% by weight to about 83% by weight of hydrogen peroxide, about 1% by weight to about 7% by weight of the aqueous basic solution including tetraalkylammonium hydroxide, about 0.01% by weight to about 3% by weight of the alcohol compound, and about 15% by weight to about 20% by weight of the ethylenediamine-based chelating agent. The etching composition may further include about 1 ppm to about 1,000 ppm of the nonionic surfactant as the additive.

According to exemplary embodiments, the etching composition described above for the UBM layer may effectively remove the impurities generated in the etching process of the UBM layer exposed by the conductive bump. The etching composition may suppress and/or reduce damage to a polyimide layer or a silicon oxynitride layer serving as a passivation layer or an aluminum layer, which may serve as a fuse, during the etching process of the UBM layer. By employing the etching composition including characteristics described above, relatively fewer and/or no impurities may remain on the conductive bump that may be brought into contact with a probe card. Thus, by employing the etching composition described above and reducing and/or eliminating the impurities on the conductive bump, it may be possible to prevent and/or reduce an increase in contact resistance during an electrical die sorting (EDS) process. Thus, a failure that may result during a performance test of the semiconductor device as a result of such impurities may be prevented and/or reduced, and reliability of the performance test(s) may be improved.

Hereinafter, a method of forming a bump structure according to exemplary embodiments will be explained in detail with reference to the accompanying drawings.

According to exemplary embodiments, a bump structure may be manufactured by forming a conductive bump on a substrate including a semiconductor chip, e.g., an LCD driver integrated circuit (LDI) chip. The bump structure(s) may be formed by, e.g., etching the UBM layer including titanium (Ti) or titanium tungsten (TiW) using the etching composition in accordance with exemplary embodiments. More particularly, e.g., an LDI chip may include a plurality of conductive bumps that play a role in the operation of the LDI chip. As conductive bumps generally play a role in the operation of a chip, characteristics of the conductive bump(s) on a semiconductor chip are important.

Hereinafter, an exemplary method of forming a bump structure will be described with reference to FIGS. 1 to 7. FIGS. 1 to 7 illustrate cross-sectional views of stages in an exemplary method of forming the bump structure.

Referring to FIG. 1, a pad 110 may be formed on a substrate 100. Various semiconductor structures (not illustrated) may be formed on the substrate 100 and the pad 110 may be electrically connected with the semiconductor structures. The pad 110 may serve as a contact electrically connecting the semiconductor structures formed on the substrate 100 with a structure formed on the pad 110. The pad 110 may be formed using a conductive material. In exemplary embodiments, the pad 110 may be formed using aluminum or copper.

A passivation layer pattern 120 exposing the pad 110 may be formed on the pad 110. The passivation layer pattern 120 may protect the semiconductor structure formed on the substrate 100. The passivation layer pattern 120 may include an opening 101 exposing the pad 110. The opening 101 may be formed by a photolithography process using a mask. In exemplary embodiments, the passivation layer pattern 120 may include, e.g., polyimide, silicon oxynitride, etc.

In exemplary embodiments, the passivation layer pattern 120 may include a first passivation layer pattern 120a and a second passivation layer pattern 120b. More particularly, a first passivation layer (not illustrated) may be formed on the pad 110 and a second passivation layer (not illustrated) may be formed on the first passivation layer. A photolithography process may be performed on the first and the second passivation layers to form the passivation layer pattern 120 including the first passivation layer pattern 120a and the second passivation layer pattern 120b on the pad 110.

Figure 2:
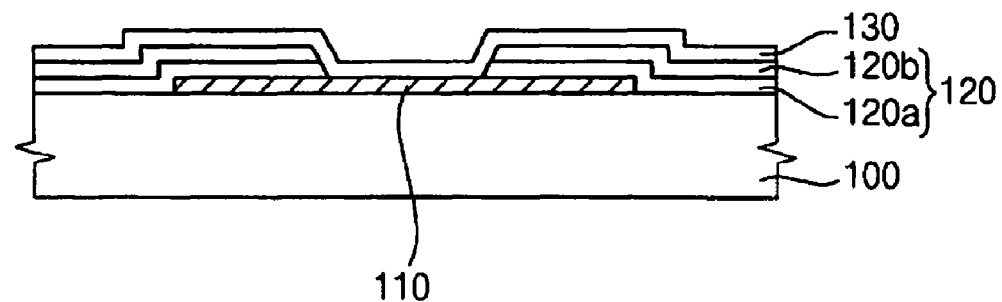

Referring to FIG. 2, a UBM layer 130 may be formed on the pad 110. More particularly, the UBM layer 130 may be formed on the passivation layer pattern 120 and on a portion of the pad 110 exposed by the opening 101 in the passivation layer pattern 120. Since a conductive bump (150, see FIG. 5) may not be directly formed on the pad 110, the UBM layer 130 may be formed on the pad 110 and the conductive bump 150 may be formed on the UBM layer 130. The UBM layer 130 may be formed using a material having high adhesive properties with the passivation layer pattern 120, having a low resistance with regard to the pad 110 and capable of reducing stress on the substrate 100. In exemplary embodiments, the UBM layer 130 may be formed using titanium (Ti), tungsten (W), chromium (Cr), copper (Cu), nickel (Ni), nickel vanadium (NiV), palladium (Pd), chromium/copper (Cr/Cu), titanium tungsten/copper (TiW/Cu), titanium tungsten/gold (TiW/Au), nickel vanadium/copper (NiV/Cu), etc. These may be used alone or in a mixture thereof. In exemplary embodiments, the UBM layer 130 may be formed, e.g., by an evaporation process, a sputtering process, an electroplating process or an electroless plating process. For example, the UBM layer 130 may be formed by sequentially depositing gold (Ag) and titanium tungsten (TiW) using a sputtering process. In such embodiments, a titanium tungsten layer may serve as a diffusion prevention layer between pad 110 and an upper wiring formed in a subsequent process. More particularly, e.g., a gold layer may improve adhesive properties between the pad 110 and the conductive bump 150 and may serve as a seed layer in an electroplating process used for forming the upper wiring.

Figure 3:
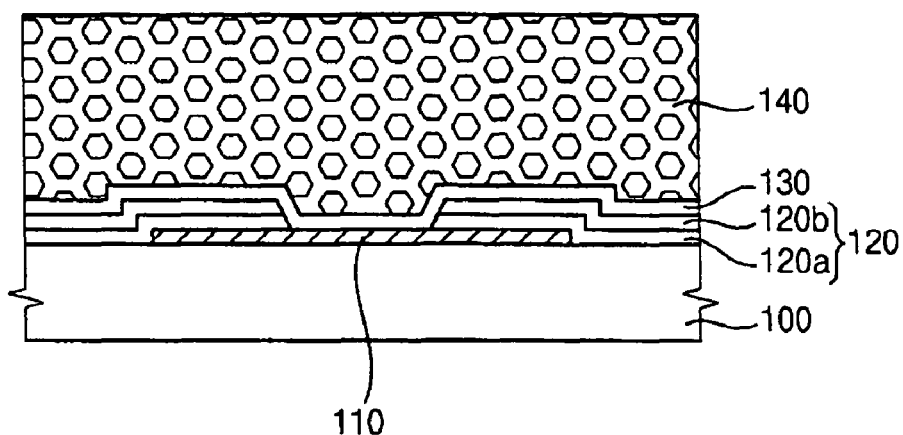

Referring to FIG. 3, a photoresist film 140 may be formed on the UBM layer 130. In exemplary embodiments, the photoresist film 140 may be formed by a spin-coating process, a roll-coating process or a slit-coating process. The photoresist film 140 may prevent a current from being transmitted to the UBM layer 130 so the UBM layer 130 may not be electroplated in the electroplating process. More particularly, the photoresist film 140 may be patterned to expose a portion of the UBM layer 130 where the conductive bump 150 may be formed. In such embodiments, the photoresist film 140 may prevent a current from being transmitted to a portion(s) of the UBM layer 130 covered by the photoresist film 140, while a current may flow to a portion of the UBM layer 130 not covered by the photoresist film 140, e.g., the portion substantially corresponding to where the conductive bump 150 may be formed.

Figure 4:
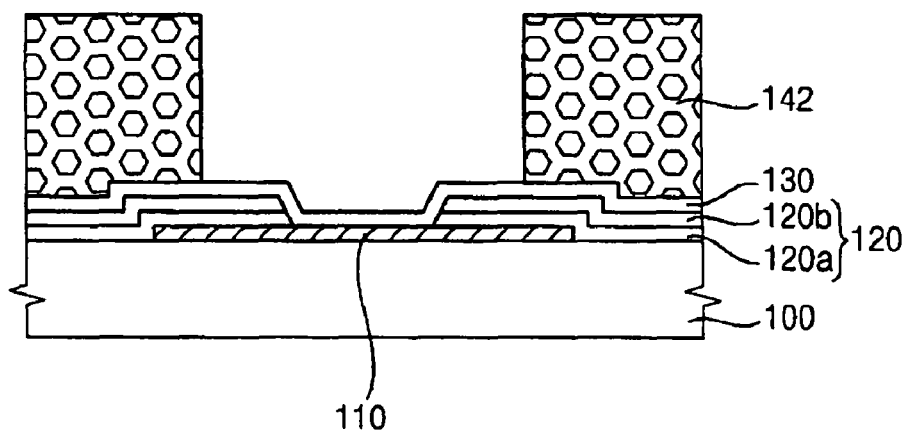

More particularly, referring to FIG. 4, the photoresist film 140 may be patterned to form a photoresist pattern 142. The photoresist pattern 142 may define the region where the conductive bump 150 may be formed on the UBM layer 130. The photoresist pattern 142 may be formed by a photolithography process. The region on which the conductive bump 150 is formed may be over the pad 110. In embodiments, after the photoresist pattern 142 is formed, a plasma ashing process may be further performed to remove residue generated during formation of the photoresist pattern 142 from the UBM layer 130.

Figure 5:
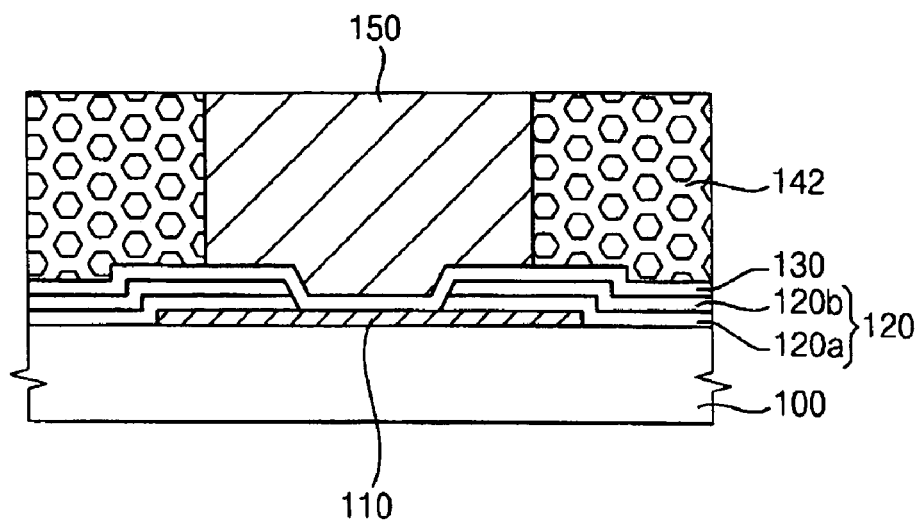

Referring to FIG. 5, the conductive bump 150 may be formed on the portion of the UBM layer 130 exposed by the photoresist pattern 142. The conductive bump 150 may have, e.g., a line shape or bar shape. In embodiments, the conductive bump 150 may be formed by the electroplating process. The electroplating process may be performed on the UBM layer 130 using the photoresist pattern 142 as a plating mask to form the conductive bump 150. In exemplary embodiments, the conductive bump 150 may be formed using an electroplating solution including a compound without a cyano group, e.g., sodium gold sulfite ($Na_3Au(SO_3)_2$).

Figure 6:
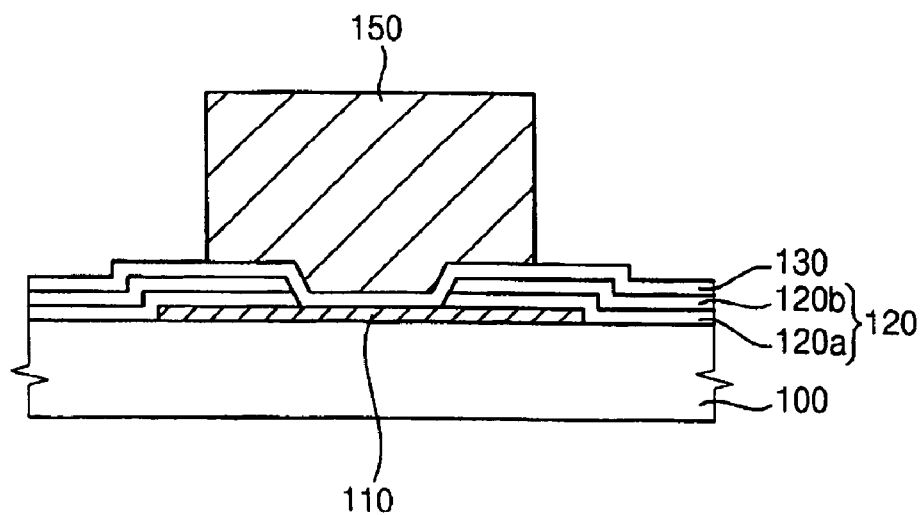

Referring to FIG. 6, the photoresist pattern 142 may be removed from the UBM layer 130. The photoresist pattern 142 may be removed by an ashing process and/or a stripping process.

Figure 7:
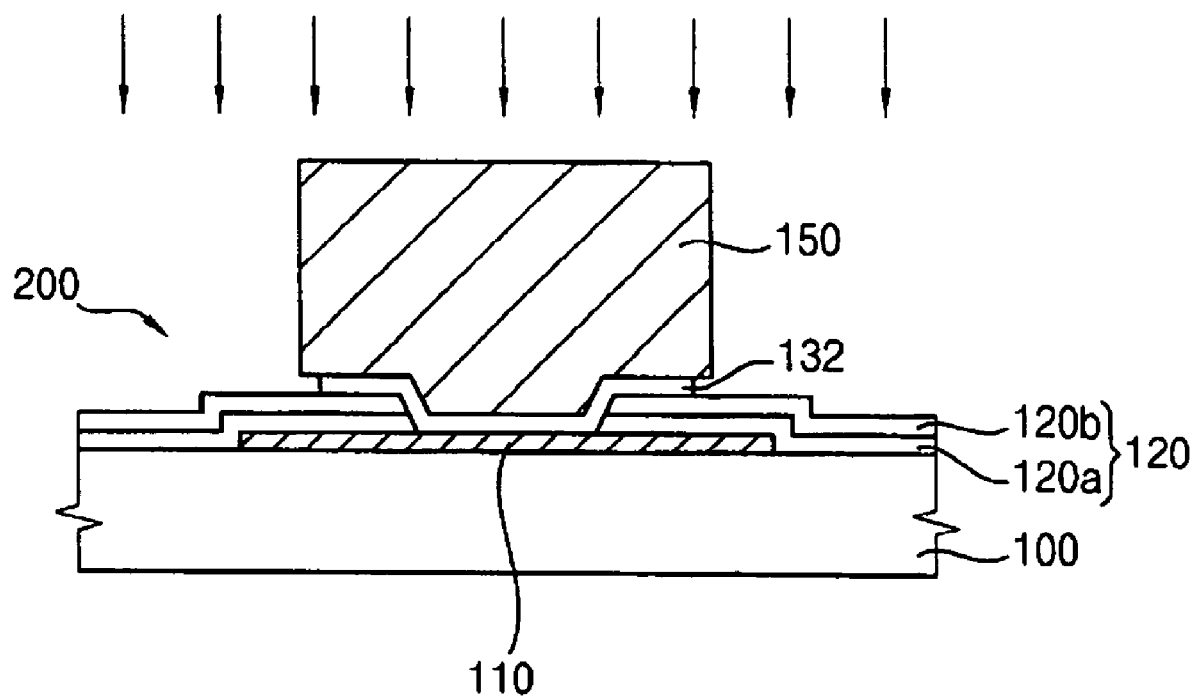

Referring to FIG. 7, the portion of the UBM layer 130 exposed by the conductive bump 150 may be etched using an etching composition and the conductive bump 150 as an etching mask to form a UBM layer pattern 132. A bump structure 200 including the pad 110, the passivation layer pattern 120, the UBM layer pattern 132 and the conductive bump 150 may be formed on the substrate 100.

The etching composition for the UBM layer 130 may include about 40% by weight to about 90% by weight of hydrogen peroxide ($H_2O_2$) as an oxidant, about 1% by weight to about 20% by weight of an aqueous basic solution including ammonium hydroxide ($NH_4OH$) or tetraalkylammonium hydroxide, about 0.01% by weight to about 10% by weight of an alcohol compound, and about 2% by weight to about 30% by weight of an ethylenediamine-based chelating agent. In exemplary embodiments, the etching composition may further include about 1 ppm to about 1,000 ppm of a nonionic surfactant.

Hydrogen peroxide may effectively dissolve oxidizing impurities including titanium (Ti), titanium oxide ($TiO_x$), tungsten (W), tungsten oxide ($WO_x$) or organic impurities that may remain on the conductive bump 150 and the UBM layer pattern 132. The aqueous basic solution including ammonium hydroxide or tetraalkylammonium hydroxide may remove titanium included in the UBM layer 130 and may dissolve the impurities, e.g., titanium, titanium oxide, aluminum (Al), aluminum oxide ($AlO_x$), the organic impurities, which may remain on the conductive bump 150. The alcohol compound may remove the organic impurities remaining on the conductive bump 150. The ethylenediamine-based chelating agent may prevent a metal ion, e.g., a titanium ion generated in the etching process, from reacting with the oxidant such as hydrogen peroxide and forming a metal oxide such as titanium oxide. The ethylenediamine-based chelating agent may react with the metal ion to form a chelate compound. In exemplary embodiments, a weight ratio of the aqueous basic solution including ammonium hydroxide to hydrogen peroxide may be in a range of about 1:6 to about 1:9. Such a ratio may prevent and/or reduce damage to the pad 110 that may include, e.g., aluminum, and/or improve an etching rate of the UBM layer 130.

More particularly, e.g., in one exemplary embodiment in which the UBM layer 130 includes, e.g., titanium, the UBM layer 130 may be etched using the etching composition including about 68% by weight to about 77% by weight of hydrogen peroxide, about 7% by weight to about 14% by weight of the aqueous basic solution including ammonium hydroxide, about 0.1% by weight to about 3% by weight of the alcohol compound, and about 15% by weight to about 20% by weight of the ethylenediamine-based chelating agent. The etching composition for the UBM layer 130 including titanium may further include about 1 ppm to about 1,000 ppm of the nonionic surfactant.

In another exemplary embodiment in which the UBM layer 130 includes, e.g., titanium tungsten, the UBM layer 130 may be etched using the etching composition including about 75% by weight to about 83% by weight of hydrogen peroxide, about 1% by weight to about 7% by weight of the aqueous basic solution including tetraalkylammonium hydroxide, about 0.01% by weight to about 3% by weight of the alcohol compound, and about 15% by weight to about 20% by weight of the ethylenediamine-based chelating agent. The etching composition for the UBM layer 130 including titanium tungsten may further include about 1 ppm to about 1,000 ppm of the nonionic surfactant.

The UBM layer 130 may be etched by immersing the substrate 100 in the etching composition. For example, the substrate 100 may be immersed in the etching composition at a temperature of about 40° C. to about 70° C. for about 1 minute to about 5 minutes.

In exemplary embodiments, after the UBM layer 130 exposed by the conductive bump 150 is etched using the etching composition, a heat treatment may be further performed on the substrate 100 on which the bump structure(s) 200 is formed. For example, the heat treatment may be performed at a temperature of about 250° C. to about 360° C. under an oxygen atmosphere or a nitrogen atmosphere.

In exemplary embodiments, after the heat treatment is performed on the substrate 100, a cleaning process may be further performed using the etching composition. For example, the cleaning process may be performed using the etching composition at a temperature of about 20° C. to about 40° C. for about 30 seconds to about 1 minute.

When the UBM layer is etched to form the bump structure(s) 200 using the etching composition, damage to the passivation layer pattern 120 including, e.g., polyimide or silicon oxynitride, and the pad 110 or a fuse including, e.g., aluminum may be reduced and/or suppressed. The impurities including, e.g., titanium, titanium oxide, tungsten, tungsten oxide, organic impurities, etc. may be effectively removed from the bump structure(s) 200. When an EDS process is performed on the bump structure(s) 200 during a subsequent process, a probe tip may not be contaminated or may be relatively less contaminated by the impurities. Thus, abrasion of the probe tip due to a cleaning process for cleaning a contaminated probe card may be prevented and/or reduced. That is, by reducing and/or eliminating contamination of the probe card by the impurities that may remain on the conductive bump(s) as a result of etching the UBM layer 130, a frequency of the cleaning process may be decreased and reliability of EDS processing and/or productivity may be improved.

Exemplary embodiments will be described below through Examples and Comparative Examples. It is understood that various changes and modifications may be made by one ordinary skilled in the art resulting in embodiments other than the examples set forth below.

Preparation of exemplary etching compositions for etching an UBM layer will be described below.

EXAMPLE 1

A solution including about 79.49% by weight of hydrogen peroxide ($H_2O_2$), about 3% by weight of an aqueous basic solution including tetramethylammonium hydroxide (TMAH), about 0.5% by weight of ethyleneglycol (EG), about 17% by weight of ethylenediaminetetraacetic acid dipotassium salt (EDTA-2K) and about 0.01% by weight of a nonionic surfactant NCW (trade name; manufactured by Wako Pure Chemical Industries, Ltd. in Japan) was prepared. The solution was stirred for about 30 minutes to prepare an etching composition for the UBM layer. The aqueous basic solution containing tetramethylammonium hydroxide included about 25% by weight of tetramethylammonium hydroxide.

EXAMPLE 2

An etching composition was prepared by performing processes substantially the same as that of Example 1 except using about 72.49% by weight of hydrogen peroxide about 10% by weight of an aqueous basic solution including ammonium hydroxide ($NH_4OH$). The aqueous basic solution containing ammonium hydroxide included about 38% by weight of ammonium hydroxide.

COMPARATIVE EXAMPLE 1

A solution including about 100% by weight of hydrogen peroxide was prepared. The solution was stirred for about 30 minutes to prepare an etching composition.

COMPARATIVE EXAMPLE 2

A solution including about 100% by weight of a diluted hydrogen fluoride (DHF) prepared. The solution was stirred for about 30 minutes to prepare an etching composition. A weight ratio between water and hydrogen fluoride in the diluted hydrogen fluoride was about 200:1.

COMPARATIVE EXAMPLE 3

An etching composition was prepared by processes substantially the same as that of Example 1 except that about 80% by weight of hydrogen peroxide was used and no NCW and ethyleneglycol (EG) were added.

COMPARATIVE EXAMPLE 4

An etching composition was prepared by processes substantially the same as that of Example 1 except that about 79.99% by weight of hydrogen peroxide was used and no ethyleneglycol (EG) was added.

COMPARATIVE EXAMPLE 5

An etching composition was prepared by processes substantially the same as those of Example 2 except that about 73% by weight of hydrogen peroxide was used and no NCW and ethyleneglycol (EG) were added.

Ingredients of the etching compositions according to Examples 1 and 2 and Comparative Examples 1 to 5 are described in the following Table 1. Contents of ingredients are represented by % by weight.

TABLE 1

| | Oxidant | | Aqueous Basic Solution | | Alcohol Compound | Chelating Agent | Surfactant |
|---|---|---|---|---|---|---|---|
| | $H_2O_2$ | DHF | TMAH | $NH_4OH$ | EG | EDTA-2K | NCW |
| Example 1 | 79.49 | — | 3 | — | 0.5 | 17 | 0.01 |
| Example 2 | 72.49 | — | — | 10 | 0.5 | 17 | 0.01 |
| Comparative Example 1 | 100 | — | — | — | — | — | — |
| Comparative Example 2 | — | 100 | — | — | — | — | — |
| Comparative Example 3 | 80 | — | 3 | — | — | 17 | — |

TABLE 1-continued

| | Oxidant | | Aqueous Basic Solution | | Alcohol Compound | Chelating Agent | Surfactant |
|---|---|---|---|---|---|---|---|
| | $H_2O_2$ | DHF | TMAH | $NH_4OH$ | EG | EDTA-2K | NCW |
| Comparative Example 4 | 79.99 | — | 3 | — | — | 17 | 0.01 |
| Comparative Example 5 | 73 | — | — | 10 | — | 17 | — |

[Experiment 1]

Evaluation of etching properties and cleaning properties of the etching compositions of Examples 1 and 2 and Comparative Examples 1 to 5. Substrates were prepared in order to evaluate of etching properties of the etching compositions according to Examples 1 and 2 and Comparative Examples 1 to 5. A titanium (Ti) layer, a titanium tungsten (TiW) layer, an aluminum (Al) layer, a silicon oxynitride (SiON) layer and a polyimide layer were formed on each of the substrates, respectively. The substrates were etched by immersing the substrates in the etching composition according to the Examples 1 and 2 and Comparative Examples 1 to 5, respectively, at a temperature of about 40° C. to about 70° C. for about 1 minute to about 5 minutes. Each of the substrates was cleaned by immersing the substrate in distilled water for about 5 minutes. Each of the substrates was then dried using argon gas or nitrogen gas. Surfaces of the substrates on which the aluminum layer, silicon oxynitride layer and the polyimide layer were formed, respectively, were observed using a microscope to confirm whether the aluminum layer, the silicon oxynitride layer and the polyimide layer were etched by the etching compositions according to Examples 1 and 2 and Comparative Examples 1 to 5. Results are illustrated in the following Table 2.

TABLE 2

| | Aluminum Layer | Silicon Oxynitride Layer | Polyimide Layer |
|---|---|---|---|
| Example 1 | O | O | O |
| Example 2 | O | O | O |
| Comparative Example 1 | O | O | O |
| Comparative Example 2 | X | Δ | Δ |
| Comparative Example 3 | o | O | O |
| Comparative Example 4 | O | O | O |
| Comparative Example 5 | O | O | O |

In Table 2, "O" denotes that the aluminum layer, the silicon oxynitride layer or the polyimide layer was not etched by the etching compositions. "o" denotes that the aluminum layer, the silicon oxynitride layer or the polyimide layer was etched a little. "Δ" denotes the aluminum layer, the silicon oxynitride layer or the polyimide layer was etched by an average amount. "X" denotes that the aluminum layer, the silicon oxynitride layer or the polyimide layer was etched a lot.

Referring to Table 2, the etching compositions of Examples 1 and 2 did not etch the aluminum layer, the silicon oxynitride layer and the polyimide layer exposed to the etching compositions while forming a bump structure. Thus, it was confirmed that the etching compositions according to Examples 1 and 2 etched the UBM layer without damaging the aluminum layer, the silicon oxynitride layer and the polyimide layer.

Evaluation of the etching properties with regard to the titanium layer and the titanium tungsten layer was performed using an automated visual inspection (AVI) system. Evaluation of cleaning properties with regard to an amount of titanium oxide remaining on the titanium layer and the titanium tungsten layer was performed using a total reflection X-ray fluorescence (TXRF) spectrometer that measured a surface density of atoms included in titanium oxide. An EDS sanding interval, i.e., a number of chips examined without performing a cleaning process of a probe tip being used, was measured using a reexamination rate of the chip. Results are illustrated in the following Table 3.

TABLE 3

| | Etching Properties | | Amount of $TiO_x$ Residue ($E^{10}$ atoms/cm$^2$) | | EDS Sanding Interval (number of chips) | |
|---|---|---|---|---|---|---|
| | TiW | Ti | TiW | Ti | TiW | Ti |
| Example 1 | O | O | 0 | 1.16 | 1,939 | 1,871 |
| Example 2 | X | O | — | 0 | — | 1,763 |
| Comparative Example 1 | O | X | 595.6 | 998.2 | 50 | 30 |
| Comparative Example 2 | — | — | — | — | — | 433 |
| Comparative Example 3 | O | Δ | 0 | 187.4 | 1,100 | 510 |
| Comparative Example 4 | O | O | 0 | 12.4 | 1,300 | 600 |
| Comparative Example 5 | X | O | — | 7.52 | — | 560 |

In Table 3 "O", "Δ" and "X" may be substantially the same as those of Table 2 and "-" denotes that the results were not measured.

Referring to Table 3, as illustrated in the etching properties of the etching compositions according to Examples 1 and 2, the etching compositions of Examples 1 and 2 efficiently etched the titanium layer. The etching composition of Example 1 including the aqueous basic solution containing tetramethylammonium hydroxide also effectively etched the titanium tungsten layer.

As illustrated in the evaluation of the amount of the titanium oxide residue, the etching composition of Example 1 exhibited better cleaning properties with regard to the titanium tungsten layer than the titanium layer. The etching composition of Example 2 including the aqueous basic solution containing ammonium hydroxide had better cleaning properties than the etching composition of Example 1 with regard to the titanium layer.

As illustrated in the EDS sanding interval, when the etching compositions of Examples 1 and 2 were used for etching the UBM layer, about 1,700 chips or more were examined using the probe tip without performing the cleaning process of the probe tip. It was confirmed that the etching compositions of Examples 1 and 2 including both the alcohol compound and the ethylenediamine-based chelating agent generated less impurities compared to the etching compositions of Comparative Examples 3 and 4 without the alcohol compound or the ethylenediamine-based chelating agent. The etching composition of Example 2 including the alcohol compound, the ethylenediamine-based chelating agent and the aqueous basic solution containing ammonium hydroxide had superior cleaning properties for efficiently removing titanium from the substrate. When the etching composition of Example 2 was used, about 1,763 chips were examined during the EDS process without performing a cleaning process for cleaning the probe tip because no titanium oxide residue was measured as remaining on the conductive bump, i.e., the TXRF spectrometer didn't detect a surface density of atoms included in titanium oxide.

[Experiment 2]

Figure 8:
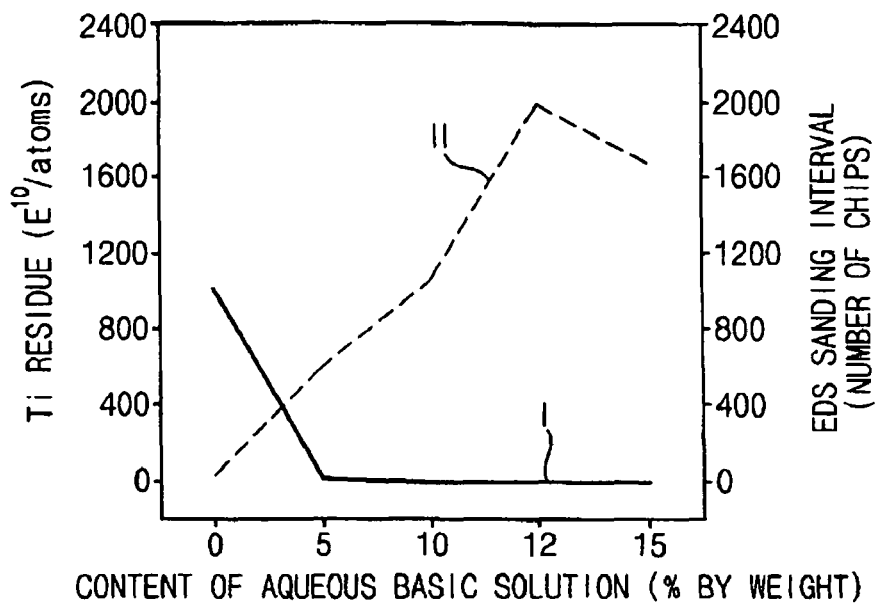
FIG. 8 illustrates a graph of cleaning properties of an etching composition with regard to titanium (Ti) according to a content of an aqueous basic solution including ammonium hydroxide.

FIG. 8 illustrates a graph of cleaning properties of an etching composition with regard to titanium according to a content of an aqueous basic solution including ammonium hydroxide ($NH_4OH$).

The cleaning properties of the etching composition was evaluated based on an amount of titanium residue remaining on a conductive bump after etching a UBM layer. The cleaning properties of the etching composition was evaluated based on an EDS sanding interval, i.e., the number of chips examined using a probe tip without performing a cleaning process of the probe tip. The amount of the titanium residue and the number of chips were measured using substantially the same methods as those of Experiment 1. In FIG. 8, "I" represents the amount of the titanium residue and "II" represents the EDS sanding interval, that is, the number of chips examined during an EDS process using the probe tip without performing a cleaning process of the probe tip.

In order to evaluate the cleaning properties of the etching composition according to exemplary embodiments, etching compositions were prepared. All the etching compositions included about 0.5% by weight of an alcohol compound, and about 15% by weight of ethylenediaminetetraacetic acid dipotassium salt (EDTA-2K). Each of the etching compositions included about 0% by weight, about 5% by weight, about 10% by weight, about 12% by weight and about 15% by weight of the aqueous basic solution including ammonium hydroxide, respectively, and a remainder of hydrogen peroxide ($H_2O_2$), respectively, based on the total amount of the etching compositions.

Referring to FIG. 8, when the etching composition included more than about 5% by weight of the aqueous basic solution including ammonium hydroxide, the titanium residue did not remain on the conductive bump after etching the UBM layer using the etching composition. As illustrated in FIG. 8, when the etching composition included about 12% by weight of the aqueous basic solution including ammonium hydroxide, about 2,000 chips were examined using the probe tip without performing the cleaning process of the probe tip. Thus, when the etching composition includes about 15% by weight of ethylenediaminetetraacetic acid dipotassium salt, the etching composition may include about 12% by weight of the aqueous basic solution including ammonium hydroxide.

[Experiment 3]

Figure 9:
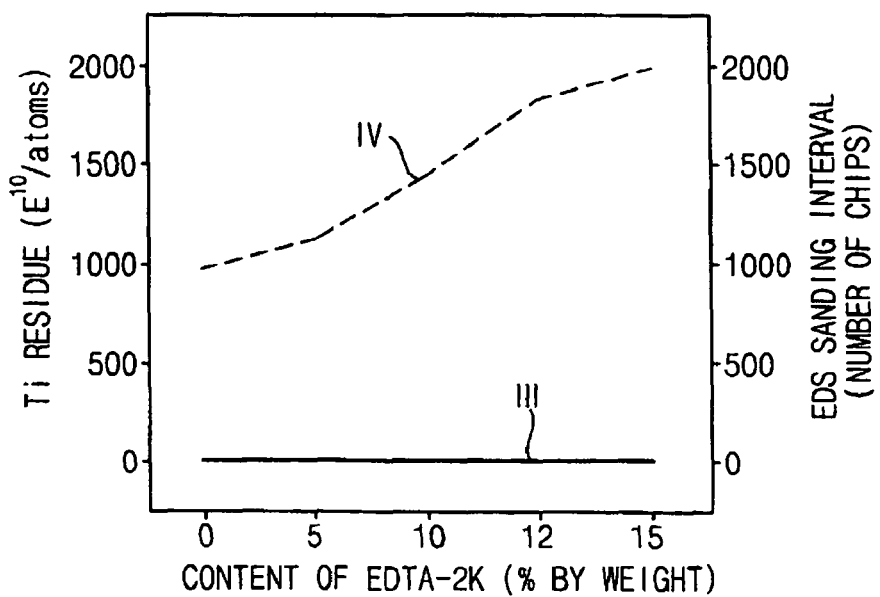
FIG. 9 illustrates a graph of cleaning properties of an etching composition with regard to titanium (Ti) according to a content of an ethylenediamine-based chelating agent.

FIG. 9 illustrates a graph illustrating of cleaning properties of an etching composition with regard to titanium according to a content of an ethylenediamine-based chelating agent.

The cleaning properties of the etching composition was evaluated based on an amount of titanium residue remaining on a conductive bump after etching a UBM layer. The cleaning properties of the etching composition was evaluated based on an EDS sanding interval, that is, a number of chips examined using a probe tip without performing a cleaning process of the probe tip. The amount of the titanium residue and the number of chips were measured performing processes substantially the same as those of Experiment 1. In FIG. 9, "III" represents the amount of the titanium residue and "IV" represents the EDS sanding interval, that is, the number of chips examined using the probe tip without performing a cleaning process of the probe tip during an EDS process.

In order to evaluate the cleaning properties of the etching composition according to exemplary embodiments, etching compositions were prepared. All the etching compositions included about 0.5% by weight of an alcohol compound, and about 12% by weight of an aqueous basic solution including ammonium hydroxide ($NH_4OH$). Each of the etching compositions included about 0% by weight, about 5% by weight, about 10% by weight, about 12% by weight and about 15% by weight of ethylenediaminetetraacetic acid dipotassium salt (EDTA-2K), respectively, and a remainder of hydrogen peroxide ($H_2O_2$), respectively, based on the total amount of the etching compositions.

Referring to FIG. 9, when the etching composition did not include ethylenediaminetetraacetic acid dipotassium salt (EDTA-2K), i.e., 0% by weight, the titanium residue did not remain on the conductive bump after etching the UBM layer using the etching composition. As the content of ethylenediaminetetraacetic acid dipotassium salt was increased from about 0% by weight to about 15% by weight, the EDS sanding interval, i.e., a number of chips examined using the probe tip was increased without performing the cleaning process of the probe tip. Thus, the cleaning properties of the etching composition increased in proportion to the content of the ethylenediamine-based chelating agent of about 0% by weight to about 15% by weight.

The etching compositions may efficiently etch the titanium layer and titanium tungsten layer without damaging the aluminum layer, silicon oxynitride layer and the polyimide layer. Further, the etching compositions may remove the impurities including titanium oxide. Thus, etching compositions according to properties described above may prevent and/or reduce contamination of a probe tip used for the EDS process.

According to embodiments, an etching composition may efficiently remove a UBM layer and impurities without damaging layers adjacent to the UBM layer and may reduce and/or prevent adhesion of impurities on a conductive bump that may result from etching the UBM layer when forming the conductive bump. Thus, the impurities may not be attached to a probe card during an EDS process and may prevent a contact resistance from increasing. Further, a frequency of a cleaning process of a probe tip may be reduced to improve productivity.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a bump structure, comprising:
    forming a pad electrically connected to a semiconductor chip on a substrate;
    forming a passivation layer pattern on the substrate, the passivation layer pattern exposing the pad;
    forming an under-bump metallurgy (UBM) layer on the passivation layer pattern and on the pad exposed by the passivation layer pattern;
    forming a conductive bump on the UBM layer; and
    removing a portion of the UBM layer using the conductive bump as a mask with an etching composition including about 40% by weight to about 90% by weight of hydrogen peroxide ($H_2O_2$), about 1% by weight to about 20% by weight of an aqueous basic solution including ammonium hydroxide ($NH_4OH$) or tetraalkylammonium hydroxide, about 0.01% by weight to about 10% by weight of an alcohol compound, about 2% by weight to about 30% by weight of an ethylenediamine-based chelating agent, and a nonionic surfactant including a copolymer of polyethylene oxide and polypropylene oxide or a block copolymer of polyethylene glycol and polypropylene glycol.

2. The method as claimed in claim 1, wherein a weight ratio of the aqueous basic solution including ammonium hydroxide to hydrogen peroxide is in a range of about 1:6 to about 1:9.

3. The method as claimed in claim 1, wherein the etching composition comprises about 68% by weight to about 77% by weight of hydrogen peroxide, about 7% by weight to about 14% by weight of the aqueous basic solution including ammonium hydroxide, about 0.1% by weight to about 3% by weight of the alcohol compound, and about 15% by weight to about 20% by weight of the ethylenediamine-based chelating agent, and the UBM layer includes titanium (Ti).

4. The method as claimed in claim 1, wherein the composition comprises about 75% by weight to about 83% by weight of hydrogen peroxide, about 1% by weight to about 7% by weight of the aqueous basic solution including tetraalkylammonium hydroxide, about 0.01% by weight to about 3% by weight of the alcohol compound, and about 15% by weight to about 20% by weight of the ethylenediamine-based chelating agent, and the UBM layer includes titanium tungsten (TiW).

5. The method as claimed in claim 1, wherein removing the portion of the UBM layer includes etching the UBM layer using the etching composition at a temperature of about 40° C. to about 70° C. for about 1 minute to about 5 minutes.

6. The method as claimed in claim 1, after removing the UBM layer, further comprising performing a heat treatment on the substrate on which the conductive bump is formed.

7. The method as claimed in claim 6, after performing the heat treatment, further comprising cleaning the bump structure using the etching composition at a temperature of about 20° C. to about 40° C. for about 30 seconds to about 1 minute.

8. The method as claimed in claim 1, wherein the UBM layer comprises at least one of titanium tungsten (TiW), chromium (Cr), copper (Cu), titanium (Ti), nickel (Ni), nickel vanadium (NiV), palladium (Pd), chromium/copper (Cr/Cu), titanium tungsten/copper (TiW/Cu), titanium tungsten/gold (TiW/Ag) and nickel vanadium/copper (NiV/Cu).

9. The method as claimed in claim 1, wherein the aqueous basic solution includes about 25% by weight to about 50% by weight of ammonium hydroxide or about 15% by weight to about 35% by weight of tetraalkylammonium hydroxide.

10. The method as claimed in claim 1, wherein the pad includes aluminum and the passivation layer includes at least one of polyimide or silicon oxynitride.

11. The method as claimed in claim 1, further comprising about 1 ppm to about 1,000 ppm of the nonionic surfactant.

* * * * *